United States Patent
Nguyen et al.

(10) Patent No.: US 7,678,705 B2
(45) Date of Patent: Mar. 16, 2010

(54) PLASMA SEMICONDUCTOR PROCESSING SYSTEM AND METHOD

(75) Inventors: Tue Nguyen, Fremont, CA (US); Tai Dung Nguyen, Fremont, CA (US)

(73) Assignee: Tegal Corporation, Petaluma, CA (US)

( * ) Notice: Subject to any disclaimer, the term of this patent is extended or adjusted under 35 U.S.C. 154(b) by 0 days.

(21) Appl. No.: 09/898,439

(22) Filed: Jul. 5, 2001

(65) Prior Publication Data
US 2003/0008500 A1 Jan. 9, 2003

(51) Int. Cl.
*H01L 21/302* (2006.01)

(52) U.S. Cl. .................. 438/729; 216/67; 118/723; 156/345; 257/E21.476

(58) Field of Classification Search ................ 257/684, 257/E21.345, 629; 118/723, 724, 725; 136/345; 438/710, 9, 709, 729; 216/67, 74–77, 68; 156/345
See application file for complete search history.

(56) References Cited

U.S. PATENT DOCUMENTS

| 4,750,077 | A | * | 6/1988 | Amagasa ..................... 361/18 |
|---|---|---|---|---|
| 5,202,095 | A | * | 4/1993 | Houchin et al. ............. 422/186 |
| 5,468,341 | A | | 11/1995 | Samukawa |
| 5,531,834 | A | * | 7/1996 | Ishizuka et al. ........... 118/723 I |
| 5,916,365 | A | | 6/1999 | Sherman |
| 5,919,342 | A | * | 7/1999 | Ngan ..................... 204/192.22 |
| 6,254,746 | B1 | * | 7/2001 | Subramani et al. ..... 204/298.11 |
| 6,401,652 | B1 | * | 6/2002 | Mohn et al. ........... 118/723 AN |
| 6,447,636 | B1 | * | 9/2002 | Qian et al. ............. 156/345.48 |
| 6,459,066 | B1 | * | 10/2002 | Khater et al. .......... 219/121.41 |
| 6,488,862 | B1 | * | 12/2002 | Ye et al. ....................... 216/67 |
| 2002/0170677 | A1 | | 11/2002 | Tucker et al. |

OTHER PUBLICATIONS

Data sheet for plasma power supply (RFG 3000W, 13.56 MHz, CE Power Supplies).
Data sheet for plasma matching network (Matchwork 10D).
Tech note 34: "Impedance Matching".
Tech note 33: "Introducing Power Supplies and Plasma Systems".
"The evolution of RF power delivery in plasma processing" by R. Heckman, G. Roche, J. R. Usher.

* cited by examiner

*Primary Examiner*—Quoc D Hoang
(74) *Attorney, Agent, or Firm*—Fliesler Meyer LLP (57) ABSTRACT

An apparatus to perform semiconductor processing includes a process chamber; a plasma generator for generating a plasma in the process chamber; and a helical ribbon electrode coupled to the output of the plasma generator.

5 Claims, 5 Drawing Sheets

PLASMA SEMICONDUCTOR PROCESSING SYSTEM AND METHOD

BACKGROUND

The present invention relates to plasma processing.

The fabrication of modern semiconductor device structures has traditionally relied on plasma processing in a variety of operations such as etching, depositing or sputtering. Plasma etching involves using chemically active atoms or energetic ions to remove material from a substrate. Plasma Enhanced Chemical Vapor Deposition (PECVD) uses plasma to dissociate and activate chemical gas so that the substrate temperature can be reduced during deposition. Plasma sputtering also deposits materials onto substrates, where plasma ions such as argon impact a material surface and sputter the material that is then transported as neutral atoms to a substrate. Additional plasma processes include plasma surface cleaning and physical-vapor deposition (PVD) of various material layers.

Conventionally, plasma is generated using a radio frequency powered plasma source. In a "typical" radio frequency powered plasma source, alternating current (AC) power is rectified and switched to provide current to an RF amplifier. The RF amplifier operates at a reference frequency (13.56 MHz, for example), drives current through an output-matching network, and then through a power measurement circuit to the output of the power supply. The output match is usually designed to be connected a generator that is optimized to drive particular impedance such as 50 ohms, in order to have the same characteristic impedance as the coaxial cables commonly used in the industry. Power flows through the matched cable sections, is measured by the match controller, and is transformed through the load match. The load match is usually a motorized automatic tuner, so the load match operation incurs a predetermined time delay before the system is properly configured. After passing through the load match, power is then channeled into a plasma excitation circuit that drives two electrodes in an evacuated processing chamber. A processing gas is introduced into the evacuated processing chamber, and when driven by the circuit, plasma is generated. Since the matching network or the load match is motorized, the response time from the matching network is typically in the order of one second or more.

Conventionally, plasma is continuously generated in order to obtain the large amount of power necessary to deposit the layers at high speed and thereby to improve the shapes of stepped parts thereof (coverage). As noted in U.S. Pat. No. 5,468,341 entitled "Plasma-etching method and apparatus therefor", the amount of ion energy reaching a surface of the object to be etched in conventional RF sources can be accomplished by controlling the power of RF waves, the controllable range of dissociation process in plasmas is narrow and, therefore, the extent of controllable etching reactions on the surface of the object wafer is narrowly limited. Also, since the magnetic fields are present in a plasma generation chamber for high-density plasmas, a magnetohydrodynamic plasma instability can exist due to, for example, drift waves generated in the plasmas, which leads to a problem wherein the ion temperature rises and the directions of ion motions become nonuniform. Further, the problems include a degradation of a gate oxide film and a distortion of etching profile due to the charges accumulated on the wafer.

In a deposition technology known as atomic layer deposition (ALD), various gases are injected into the chamber for as short as 100-500 milliseconds in alternating sequences. For example, a first gas is delivered into the chamber for about 500 milliseconds and the substrate is heated, then the first gas (heat optional) is turned off. Another gas is delivered into the chamber for another 500 milliseconds (heat optional) before the gas is turned off. The next gas is delivered for about 500 milliseconds (and optionally heated) before it is turned off. This sequence is done for until all gases have been cycled through the chamber, each gas sequence forming a monolayer which is highly conformal. ALD technology thus pulses gas injection and heating sequences that are between 100 and 500 milliseconds. This approach has a high dissociation energy requirement to break the bonds in the various precursor gases such as silane and oxygen and thus requires the substrate to be heated to a high temperature, for example in the order of 600-800 degree Celsius for silane and oxygen processes Conventional ALD equipment typically uses coils with the same width to height aspect ratio. The plasma density for the conventional equipment is focused at the coil. The density is high near the coil, and typically the density becomes uniform at about five inches from the coil. Such non-linearity in plasma density is undesirable.

SUMMARY

In one aspect, an apparatus to perform semiconductor processing includes a process chamber; a plasma generator for generating a plasma in the process chamber; and a helical ribbon electrode coupled to the output of the plasma generator.

Implementations of the above aspect may include one or more of the following. The helical ribbon electrode can be external to the process chamber. A dielectric wall can be positioned between the chamber and the helical ribbon electrode. The dielectric wall can be a flat plate. The dielectric wall can be concave or convex. The dielectric wall can also be a tube, in which case the dielectric wall projects through the center of the helical ribbon electrode. The helical ribbon electrode can be internal to the process chamber with the electrode passing through the chamber by an electrical feedthrough. The apparatus can receive a wafer in the chamber, where the distance between the helical ribbon electrode and the wafer is less than five inches, including between approximately one inch and approximately three inches. The plasma generator can pulse the helical ribbon electrode to perform pulse processing.

The typical tune response time of the plasma generator is less than one hundred milliseconds. The plasma generator is a radio frequency (RF) plasma generator. The plasma generator is a solid state plasma generator without any moving parts therefore capable of short tuning response time. The plasma generator is a solid state plasma generator employing frequency tuning to achieve output matching. The plasma generator is a solid state plasma generator, further comprising a switching power supply; an amplifier coupled to the power supply; a reference frequency generator coupled to the amplifier; a power measurement circuit providing feedback to a comparator and to the reference frequency generator; an output match section coupled to the power measurement circuit; and a plasma excitation circuit coupled to the output match section. The apparatus can include a plurality of precursor inlets The precursor from the precursor inlets are excited by the plasma when the plasma generator is on. The controller is computer controlled. The controller turns on the plasma generator for a plasma-enhanced deposition of a layer in the process chamber. The controller turns on and off the plasma generator multiple times to perform pulsed plasma processing in the process chamber. The controller is computer controlled to deposit multiple layers in the process chamber. The multiple layers comprise plasma-assisted layers and non plasma-assisted layers.

In another aspect, a method deposits a multi-layer semiconductor by (a) introducing a gas into a processing chamber; (b) generating a pulse with a response time of less than one second; and (c) exciting the plasma in accordance with the pulse using a helical ribbon electrode.

Implementations of the above aspect may include one or more of the following. The method includes purging the chamber. The method can also include sequentially pulsing the plasma for each layer to be deposited.

In another aspect, a multi-layer semiconductor processing chamber includes a gas source coupled to the chamber for introducing a processing gas into a reaction chamber having a sample disposed therein; a solid state RF plasma source coupled to the chamber to excite the processing gas; a helical ribbon electrode coupled to the output of the plasma generator; and a controller coupled to the solid state RF plasma source to pulse the solid state RF plasma source for each deposited layer.

Implementations of the above aspect may include one or more of the following. The solid state RF plasma source can include a switching power supply; an RF amplifier coupled to the power supply; a reference frequency generator coupled to the RF amplifier; a power measurement circuit providing feedback to a comparator and to the reference frequency generator; an output match section coupled to the power measurement circuit; and a plasma excitation circuit coupled to the output match section. The chamber can include a means for purging the chamber. The controller can sequentially pulse the plasma for each layer to be deposited.

Advantages of the system may include one or more of the following. The helical ribbon provides a highly uniform plasma and also results in a chamber with a small volume. The system enables high precision etching, deposition or sputtering performance. This is achieved using the pulse modulation of a radio frequency powered plasma source, which enables a tight control the radical production ratio in plasmas, the ion temperature and the charge accumulation. Also, since the time for accumulation of charges in a wafer is on the order of milli-seconds, the accumulation of charges to the wafer is suppressed by the pulse-modulated plasma on the order of micro-seconds, and this enables the suppression of damage to devices on the wafer caused by the charge accumulation and of notches caused during the electrode etching process. The system requires that the substrate be heated to a relatively low temperature such as 400 degrees Celsius.

Other advantages may include one or more of the following. The system attains highly efficient plasma operation in a compact substrate process module that can attain excellent characteristics for etching, depositing or sputtering of semiconductor wafers as represented by high etch rate, high uniformity, high selectivity, high anisotropy, and low damage. The system achieves high density and highly uniform plasma operation at low pressure for etching substrates and for deposition of films on to substrates. Additionally, the system is capable of operating with a wide variety of gases and combinations of gases, including highly reactive and corrosive gases.

DESCRIPTION

Figure 1A:
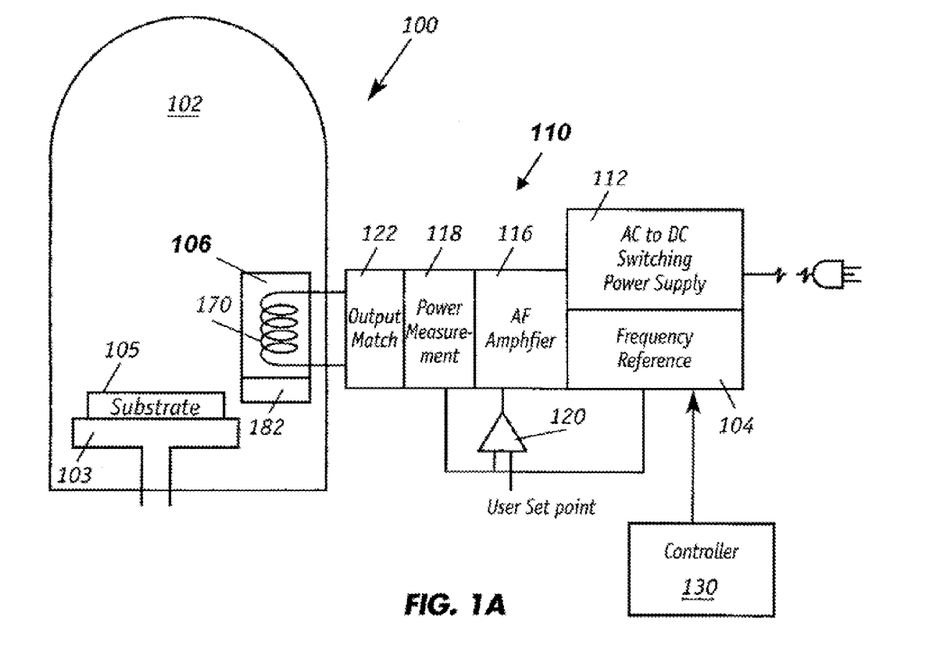
FIGS. 1A-1E show exemplary embodiments of a plasma processing system with a helical ribbon.

FIG. 1A shows an exemplary plasma processing system 100 with a processing chamber 102. The process chamber 102 has a chamber body enclosing components of the process chamber such as a chuck 103 supporting a substrate 105. The process chamber typically maintains vacuum and provides a sealed environment for process gases during substrate processing. On occasions, the process chamber needs to be periodically accessed to cleanse the chamber and to remove unwanted materials cumulating in the chamber. To support maintenance for the process chamber, an opening is typically provided at the top of the process chamber that is sufficiently large to provide access to the internal components of the process chamber.

The chamber 102 includes a plasma excitation circuit 106 driven by a solid-state plasma generator 110 with fast ignition capability. One commercially available plasma source is the Litmas source, available from LITMAS Worldwide of Matthews, N.C. The generator 110 includes a switching power supply 112 that is connected to an alternating current (AC) line. The power supply 112 rectifies AC input and switches the AC input to drive an RF amplifier 116. The RF amplifier 116 operates at a reference frequency (13.56 MHz, for example) provided by a reference frequency generator 104. The RF amplifier 116 drives current through a power measurement circuit 118 that provides feedback signals to a comparator 120 and to the reference frequency generator 104. In this embodiment, power is measured only once, and the information is used to control the RF amplifier 116 gain, as well as a tuning system if needed. Power is then delivered to an output match section 122, which directly drives the plasma excitation circuit 106. In one embodiment, the plasma excitation circuit 106 uses helical ribbon electrodes 170 in the chamber. However, other equivalent circuits can be used, including an external electrode of capacitance coupling or inductance coupling type, for example. Positioned above the helical ribbon electrodes 170 is a heat exchanger 182 that removes heat from the helical ribbon electrodes 170 during operation. In one embodiment, the heat exchanger is a pipe that circulates fluid to remove heat. The fluid moves through the pipe and the helical ribbon electrodes 170. Fluid then enters the heat exchanger 182 and traverses through a loop. Thermal energy in the form of heat transfers to fluid in another loop, which is cooler in temperature and draws heat away from the heat in the fluid in the first loop. In a specific embodiment, cooling fluid enters and leaves the heat exchanger 182.

A controller 130 generates a periodic pulse and drives one input of the frequency reference 104. The pulse effectively turns on or off the plasma generation. One embodiment of the controller 130 generates a pulse with a frequency of ten hertz (10 Hz) or less. In another embodiment, the pulse generated has a pulse-width of approximately two hundred fifty (250) millisecond and the pulse is repeated approximately every fifty (50) microseconds.

Figure 1B:
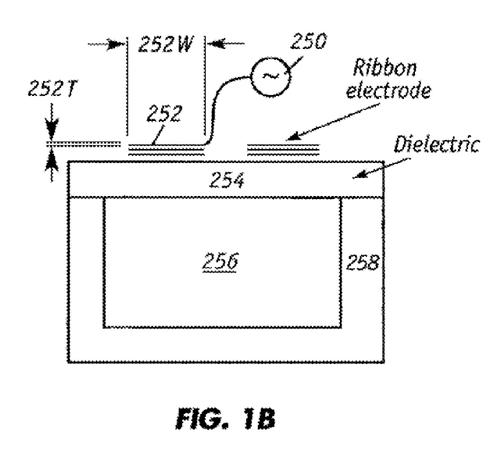

Turning now to FIG. 1B, a second embodiment is shown. FIG. 1B includes a helical ribbon electrode 252 connected to a generator 250. The helicon ribbon 252 as shown is composed of 3 coils, each having a thickness 252T and a substantially greater width 252W. The helical ribbon electrode 252 rests above a dielectric wall 254. The dielectric wall 254 rests above a chamber 256 and is supported by chamber walls 258. The dielectric wall 254 allows the energy generated from the generator 250 to pass through to generate a plasma inside the chamber 256. The dielectric materials can be any non-metallic materials such as ceramics, glass, quartz, or plastic.

Figure 1C:
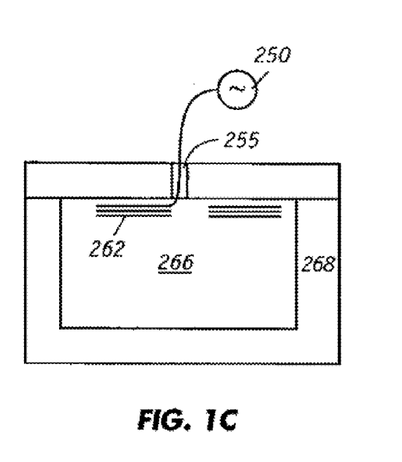

FIG. 1C shows a third embodiment where the helical ribbon electrode 262 is positioned inside a chamber 266 with walls 268. The walls 268 has a electrical feed through 255 through which the generator 250 can drive the helical ribbon electrode 262.

Figure 1D:
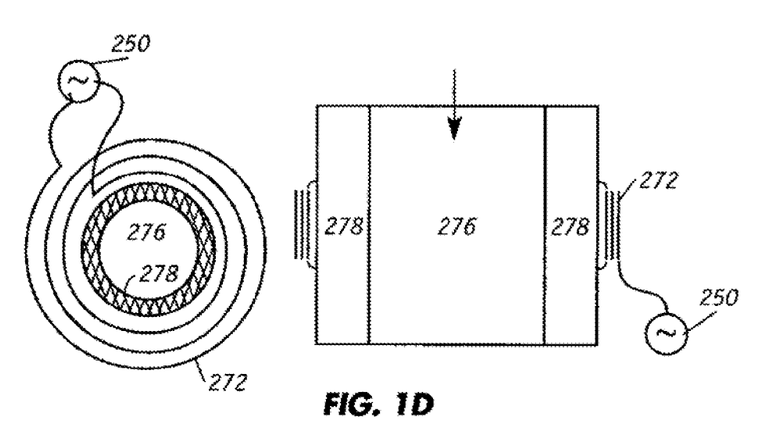

FIG. 1D shows a fourth embodiment where the helical ribbon electrode 272 wraps around a tubular dielectric wall 278. A chamber 276 is positioned within the helical ribbon electrode 272 and the tubular dielectric wall 278.

Figure 1E:
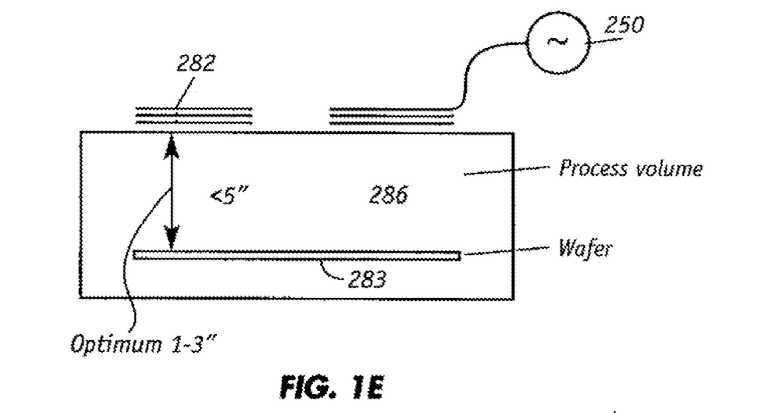

FIG. 1E shows a fifth embodiment optimized for pulsed processing. This embodiment defines an elongated chamber 286 with a small volume above a wafer 283. The volume is dependent on the diameter of the wafer 283 and the distance between a helical ribbon electrode 282 and the wafer. Typically, the distance is less than five (5) inches, but can also be between one and three inches. The helical ribbon electrode 252 in turn is driven by the generator 250. The large ratio of the width to the thickness of the ribbon electrode allows the short distance (less than 5 inches, and typically between 1 and 3 inches) and still offers the plasma uniformity required on the wafer surface.

The characteristics of a film deposited by the above techniques are dependent upon the electron temperature in the plasma, the energy of ion incident on a substrate, and the ion and radical produced in the vicinity of an ion sheath. The electron temperature distribution in the plasma, the kind of each of the ion and radical produced in the plasma, and the ratio between the amount of the ion and the amount of the radical, can be controlled by modulating a high-frequency voltage in the same manner as having been explained with respect to the plasma etching. Accordingly, when conditions for depositing a film having excellent characteristics are known, the discharge plasma is controlled by a modulated signal according to the present invention so that the above conditions are satisfied. Thus, the processing characteristics with respect to the film deposition can be improved.

Figure 2A:
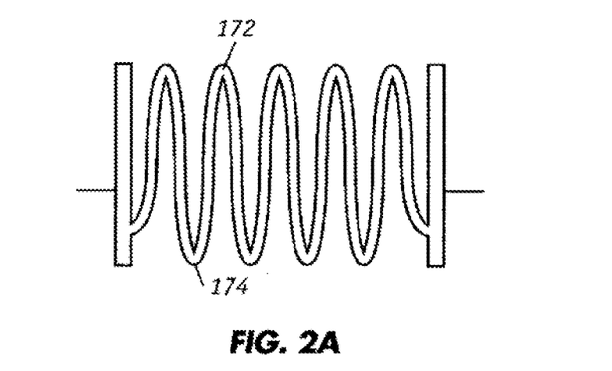
FIGS. 2A-2C show more details of the helical ribbon of FIG. 1.
Figure 2B:
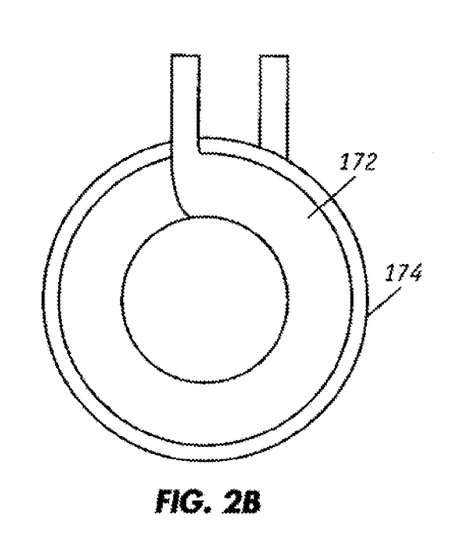
Figure 2C:
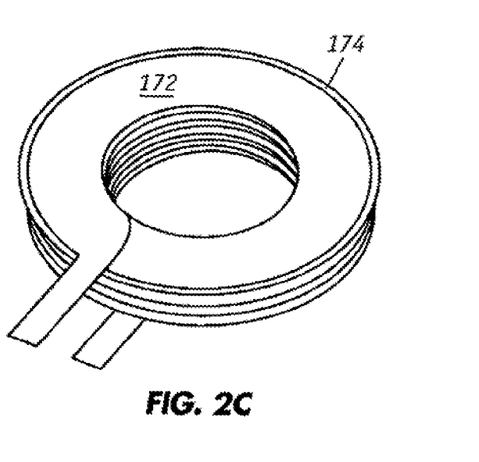

FIGS. 2A-2C show more details of the helical ribbon 170. In FIG. 2A, an elongate conductive coil 172 insulated by a sheet of dielectric material 174 is wound to form a cylindrical helix. The two sides of the helix are then compressed into planes such that the coil 172 surfaces in each side lie flat and engage the adjacent side of the sheet of dielectric material 174.

The ribbon coil 172 may have about three to ten turns and may be made of any conductive, ductile metal, such as copper or aluminum. The coil 172 has a width that is substantially greater than its thickness. Preferably, the width is approximately one hundred times the thickness, although the ratio of width "w" to thickness "t" may conceivably range from 10,000 to 1, depending on mechanical considerations and/or electrical parameters. Mechanical considerations affecting the optimum width/thickness ratio include, for example, build height and turns ratio. In one embodiment, the coil 172 has three turns, with the width of the coil 172 at about 40 millimeters and a thickness at about one millimeter.

Electrical parameters affecting the optimum width/thickness ratio include electrical resistance, skin effect, and proximity effect, for example. During manufacturing, the conductive coil 172 and dielectric sheet 174 are wound in one continuous direction on a cylindrical mandrel and then compressed into a plane. With the exception of the outermost coil layers, the compressed coil engages on one side a sheet 174A of dielectric material, and on the other side a sheet 174B of dielectric material. Bends (not illustrated) are formed in the ribbon coil 172 near the ends so that the ends project radially from conductive coil 172 for external connection.

The conductive coil 172 is then compressed into a plane such that the coils lie flat and engage one side of the dielectric material sheet 174. The compressed sides form flat, concentric spirals. The width conductive coil 172 is smaller than the width of the dielectric material sheet 172 such that, when compressed, the interior or exterior of adjacent coil surfaces does not touch. The ends of the ribbon coil 172 project from the outer coil surfaces, where attachment to other electrical components can readily be accomplished.

The coil 172 may be adhered to sheet 174 of dielectric material by at least two methods. One method is to provide a sheet of dielectric material that is coated on both sides with thermal set adhesive (not illustrated). After compression, a winder is heated sufficiently to activate the thermal set adhesive to adhere the coil 172 to the dielectric material sheet 174. Alternatively, the coil 172 may be adhered to sheet 174 by insulating adhesive tape (not illustrated) disposed between each coil layer. In one embodiment, the helical ribbon 170 is available from LITMAS Corporation of Matthews, N.C.

The helical ribbon 170 enhances the uniformity of power density due to its width/thickness ratio. Power transmittance is higher because the ribbon 170 is closer to chamber. Hence, power loss is reduced. The ribbon 170 is low in profile, and supports a high density, low profile semiconductor processing system.

Figure 3:
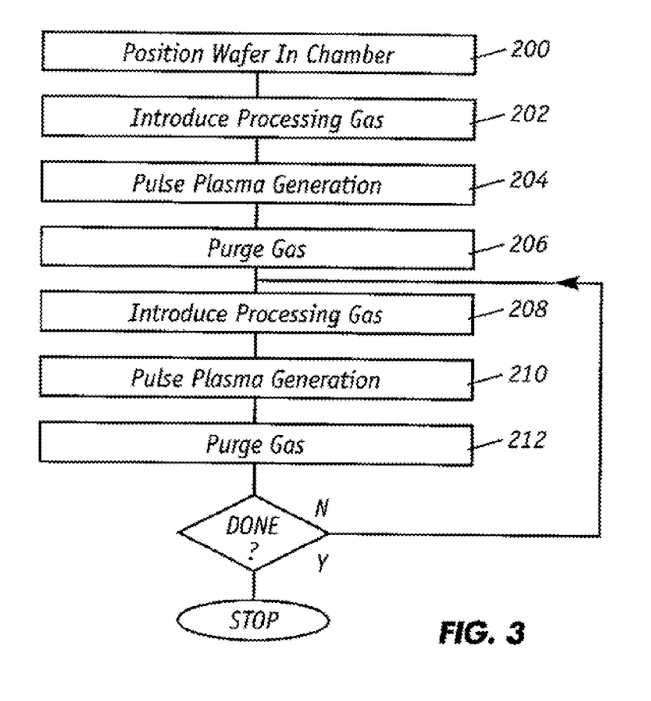
FIG. 3 shows a flowchart of one exemplary semiconductor manufacturing process using the system of FIG. 1.

FIG. 3 shows a flowchart of one exemplary semiconductor manufacturing process using the system 100 of FIG. 1. First, a wafer is positioned inside the chamber (step 200). Next, suitable processing gas is introduced into the chamber (step 202), and the controller 130 is periodically turned on in accordance with a process activation switch to drive the desired process (step 204). The particular type of process to be performed affects the process activation switch choice. The choice of activation switch for any device fabrication process, regardless of whether the process is a deposition or etch process, also may significantly affect the final semiconductor device properties. At the conclusion of the processing of one layer of material, the gas in the chamber is purged (step 206), and the chamber is ready to accept further processing. Thus, for the next layer of material, suitable processing gas is introduced into the chamber (step 208), and the controller 130 is periodically turned on to drive the desired process (step 210). At the conclusion of the processing of the second layer of material, the gas in the chamber is purged (step 212), and the chamber is ready to accept yet another layer of material. This process is repeated for each layer in the multi-layer wafer.

Figure 4A:
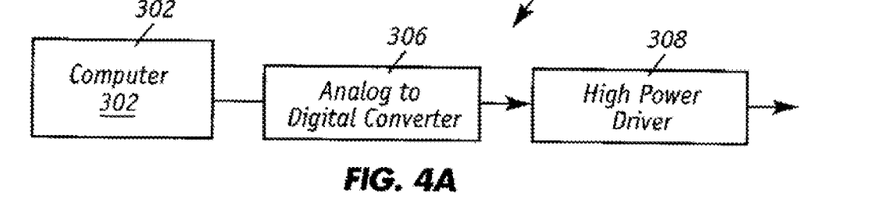
FIGS. 4A-4B show exemplary generator embodiments.

FIG. 4A shows one exemplary controller 300. The controller 300 includes a computer 302 driving a digital to analog converter (DAC) 306. The DAC 306 generates shaped waveforms and is connected to a high-voltage isolation unit 308 such as a power transistor or a relay to drive the plasma generator 110. The controller 300 can generate various waveforms such as a rectangular wave and a sinusoidal wave, and moreover can change the period and amplitude of such waveforms. Further, in the above explanation, the RF power supplied to a plasma is modulated with a rectangular wave.

However, the modulation waveform is not limited to the rectangular wave. In other words, when a desired ion energy distribution, a desired electron temperature distribution, and a desired ratio between the amount of the desired ion and the amount of the desired radical, are known, the modulation waveform is determined in accordance with these factors. The use of a rectangular wave as the modulation waveform has an advantage that a processing condition can be readily set and the plasma processing can be readily controlled. It is to be noted that since the rectangular wave modulates the signal from the RF source in a discrete fashion, the rectangular wave can readily set the processing condition, as compared with the sinusoidal wave and the compound wave of it. Further, the pulse generator can also generate amplitude modulated signals in addition or in combination with the frequency modulated signals.

Figure 4B:
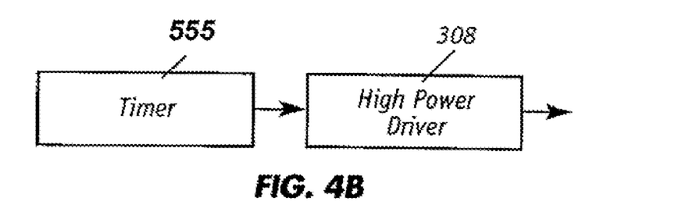

FIG. 4B shows an exemplary embodiment that uses a timer chip such as a 555 timer, available from Signetics of Sunnyvale, Calif. The timer chip 555 is preconfigured through suitable resistive-capacitive (RC) network to generate pulses at specified intervals. The timer chip 555 generates shaped waveforms and is connected to a high-voltage isolation unit 308 such as a power transistor or a relay to drive the plasma generator 110, as discussed above.

Figure 5:
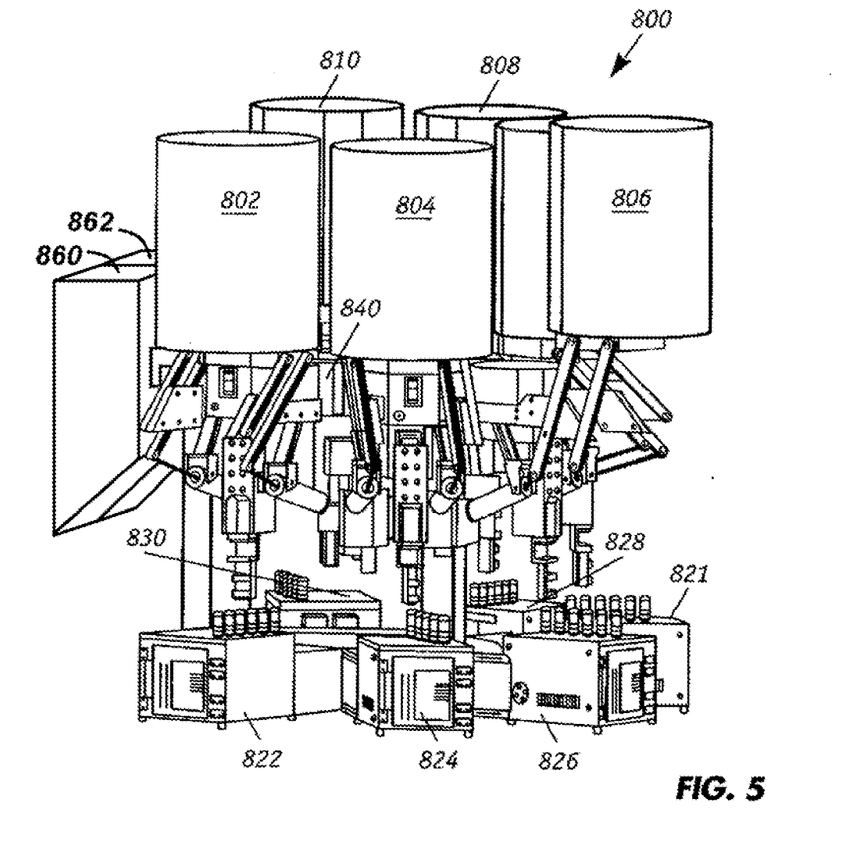
FIG. 5 shows a multi-chamber semiconductor processing system.

Referring now to FIG. 5, a multi-chamber semiconductor processing system 800 is shown. The processing system 800 has a plurality of chambers 802, 804, 806, 808 and 810 adapted to receive and process wafers 842. Controllers 822, 824, 826, 828 and 830 control each of the chambers 802, 804, 808 and 810, respectively. Additionally, a controller 821 controls another chamber, which is not shown for illustrative purposes.

Each of chambers 802-810 provides a lid on the chamber body. During maintenance operations, the lid can be actuated into the open position so that components inside the chamber body can be readily accessed for cleaning or replacement as needed.

The chambers 802-810 are connected to a transfer chamber 840 that receives a wafer. The wafer rests on top of a robot blade or arm. The robot blade receives wafer from an outside processing area.

The transport of wafers between processing areas entails passing the wafers through one or more doors separating the areas. The doors can be load lock chambers 860-862 for passing a wafer-containing container or wafer boat that can hold about twenty-five wafers in one embodiment. The wafers are transported in the container through the chamber from one area to another area. The load lock can also provide an air circulation and filtration system that effectively flushes the ambient air surrounding the wafers.

Each load lock chamber 860 or 862 is positioned between sealed opening, and provides the ability to transfer semiconductor wafers between fabrication areas. The load locks 860-862 can include an air circulation and filtration system that effectively flushes the ambient air surrounding the wafers. The air within each load lock chamber 860 or 862 can also be purged during wafer transfer operations, significantly reducing the number of airborne contaminants transferred from one fabrication area into the other. The load lock chambers 860-862 can also include pressure sensors that take air pressure measurements for control purposes.

During operation, a wafer cassette on a wafer boat is loaded at openings in front of the system to a load lock through the load lock doors. The doors are closed, and the system is evacuated to a pressure as measured by the pressure sensors. A slit valve (not shown) is opened to allow the wafer to be transported from the load lock into the transfer chamber. The robot blade takes the wafer and delivers the wafer to an appropriate chamber. A second slit valve opens between the transfer chamber and process chamber, and wafer is brought inside the process chamber.

Containers thus remain within their respective fabrication areas during wafer transfer operations, and any contaminants clinging to containers are not transferred with the wafers from one fabrication area into the other. In addition, the air within the transfer chamber can be purged during wafer transfer operations, significantly reducing the number of airborne contaminants transferred from one fabrication area into the other. Thus during operation, the transfer chamber provides a high level of isolation between fabrication stations.

Figure 6:
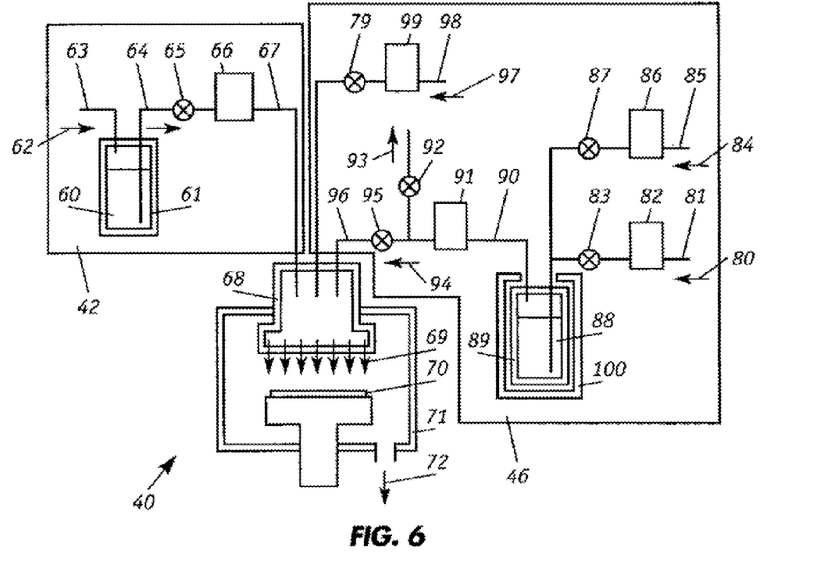
FIG. 6 shows an exemplary an apparatus for liquid and vapor precursor delivery.

FIG. 6 shows an exemplary an apparatus 40 for liquid and vapor precursor delivery using either the system 100 or the system 300. The apparatus 40 includes a chamber 71 such as a CVD chamber. The chamber 71 includes a chamber body that defines an evacuable enclosure for carrying out substrate processing. The chamber body has a plurality of ports including at least a substrate entry port that is selectively sealed by a slit valve and a side port through which a substrate support member can move. The apparatus 40 also includes a vapor precursor injector 46 connected to the chamber 71 and a liquid precursor injector 42 connected to the chamber 71.

In the liquid precursor injector 42, a precursor 60 is placed in a sealed container 61. An inert gas 62, such as argon, is injected into the container 61 through a tube 63 to increase the pressure in the container 61 to cause the copper precursor 60 to flow through a tube 64 when a valve 65 is opened. The liquid precursor 60 is metered by a liquid mass flow controller 66 and flows into a tube 67 and into a vaporizer 68, which is attached to the CVD chamber 71. The vaporizer 68 heats the liquid causing the precursor 60 to vaporize into a gas 69 and flow over a substrate 70, which is heated to an appropriate temperature by a susceptor to cause the copper precursor 60 to decompose and deposit a copper layer on the substrate 70. The CVD chamber 71 is sealed from the atmosphere with exhaust pumping 72 and allows the deposition to occur in a controlled partial vacuum.

In the vapor precursor injector 46, a liquid precursor 88 is contained in a sealed container 89 which is surrounded by a temperature controlled jacket 91 and allows the precursor temperature to be controlled to within $0.1°$ C. A thermocouple (not shown) is immersed in the precursor 88 and an electronic control circuit (not shown) controls the temperature of the jacket 91, which controls the temperature of the liquid precursor and thereby controls the precursor vapor pressure. The liquid precursor can be either heated or cooled to provide the proper vapor pressure required for a particular deposition process. A carrier gas 80 is allowed to flow through a gas mass flow controller 82 when valve 83 and either valve 92 or valve 95 but not both are opened. Also shown is one or more additional gas mass flow controllers 86 to allow additional gases 84 to also flow when valve 87 is opened, if desired. Additional gases 97 can also be injected into the vaporizer 68 through an inlet tube attached to valve 79, which is attached to a gas mass flow controller 99. Depending on its vapor pressure, a certain amount of precursor 88 will be carried by the carrier gases 80 and 84, and exhausted through tube 93 when valve 92 is open.

After the substrate has been placed into the CVD chamber 71, it is heated by a heater. After the substrate has reached an appropriate temperature, valve 92 is closed and valve 95 is opened allowing the carrier gases 80 and 84 and the precursor vapor to enter the vaporizer 68 through the attached tube 96 attached tube 96. Such a valve arrangement prevents a burst of vapor into the chamber 71. The precursor 88 is already a vapor and the vaporizer is only used as a showerhead to evenly distribute the precursor vapor over the substrate 70. After a predetermined time, depending on the deposition rate of the copper and the thickness required for the initial copper deposition, valve 95 is closed and valve 92 is opened. The flow rate of the carrier gas can be accurately controlled to as little as 1 sccm per minute and the vapor pressure of the precursor can be reduced to a fraction of an atmosphere by cooling the precursor 88. Such an arrangement allows for accurately controlling the copper deposition rate to less than 10 angstroms per minute if so desired. Upon completion of the deposition of the initial copper layer, the liquid source delivery system can be activated and further deposition can proceed at a more rapid rate.

Figure 7A:
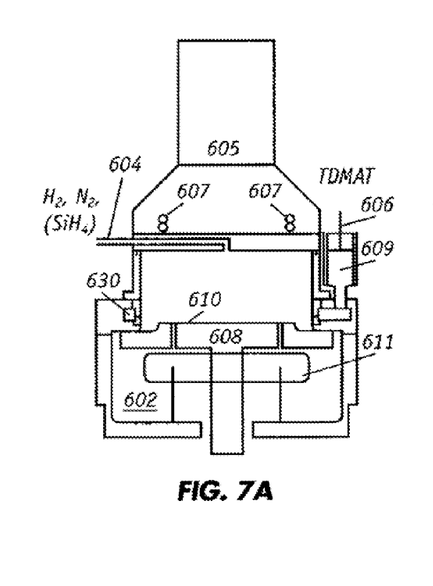
FIGS. 7A-7B show two operating conditions of an embodiment to perform barrier pulsed plasma atomic layer deposition.
Figure 7B:
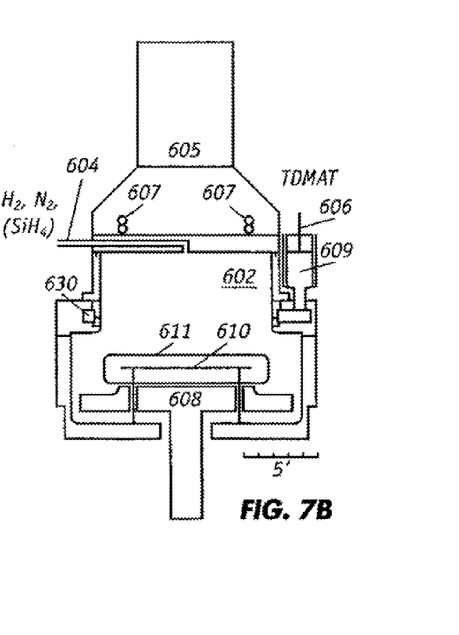

FIGS. 7A-7B show two operating conditions of an embodiment to perform barrier pulsed plasma atomic layer deposition. FIG. 7A shows the embodiment in a deposition condition, while FIG. 7B shows the embodiment in a rest condition. Referring now to FIGS. 7A-7B, a chamber 602 receives gases through one or more gas inlets 604. A solid state plasma generator 605 is mounted on top of the chamber 602 and one or more plasma excitation coils 607 are positioned near the gas inlets 604. A liquid precursor system 606 introduces precursor gases through a vaporizer 609 into the chamber 602 using a precursor distribution ring.

A chuck 608 movably supports a substrate 610. In FIG. 7A, the chuck 608 and the substrate 610 are elevated and ready for deposition. The substrate 610 is positioned inside the chamber. Suitable processing gas is introduced into the chamber through the inlets 604, and a pulsed plasma controller 605 is periodically turned on in accordance with a process activation switch to drive the desired process. The particular type of process to be performed affects the process activation switch choice. The choice of activation switch for any device fabrication process, regardless of whether the process is a deposition or etch process, also may significantly affect the final semiconductor device properties. At the conclusion of the processing of one layer of material, the gas in the chamber 602 is purged, and the chamber 602 is ready to accept further processing. This process is repeated for each layer in the multi-layer wafer. At the conclusion of deposition of all layers, the chuck 608 is lowered and the substrate 610 can be removed through an opening 611.

The system allows the substrates to have temperature uniformity through reliable real-time, multi-point temperature measurements in a closed-loop temperature control. The control portion is implemented in a computer program executed on a programmable computer having a processor, a data storage system, volatile and non-volatile memory and/or storage elements, at least one input device and at least one output device.

Each computer program is tangibly stored in a machine-readable storage medium or device (e.g., program memory or magnetic disk) readable by a general or special purpose programmable computer, for configuring and controlling operation of a computer when the storage media or device is read by the computer to perform the processes described herein. The invention may also be considered to be embodied in a computer-readable storage medium, configured with a computer program, where the storage medium so configured causes a computer to operate in a specific and predefined manner to perform the functions described herein.

It should be realized that the above examples represent a few of a virtually unlimited number of applications of the plasma processing techniques embodied within the scope of the present invention Furthermore, although the invention has been described with reference to the above specific embodiments, this description is not to be construed in a limiting sense. For example, the duty ratio, cycle time and other parameter/condition may be changed in order to obtain a desired characteristic for the wafer.

Various modifications of the disclosed embodiment, as well as alternative embodiments of the invention will become apparent to persons skilled in the art upon reference to the above description. The invention, however, is not limited to the embodiment depicted and described. For instance, the radiation source can be a radio frequency heater rather than a lamp. Hence, the scope of the invention is defined by the appended claims. It is further contemplated that the appended claims will cover such modifications that fall within the true scope of the invention.

What is claimed is:

1. An improved apparatus for semiconductor processing, the improvement comprising a helical ribbon electrode, wherein the helical ribbon electrode comprises a compressed double helix including a first helix having a plurality of flat concentric spiral coils and a complementary second helix having a sheet of dielectric material overlapping the surface of the flat concentric spiral coils, each said flat concentric spiral coil comprising a ribbon-like form, said ribbon-like form comprising a width and a thickness wherein the width is substantially greater than the thickness, the width lying in a plane that faces another of said plurality of flat concentric spiral coils, and the thickness corresponding to a plane that is substantially parallel to a direction of stacking of said plurality of flat concentric spiral coils.

2. The improved apparatus of claim 1, wherein the first helix has three to ten turns.

3. An apparatus for semiconductor processing, the apparatus comprising:
   a process chamber;
   a solid state RF plasma generator coupled to the process chamber to excite a processing gas and generate a plasma;
   a controller coupled to the solid state RF plasma generator to pulse the solid state radio frequency plasma generator for each deposited layer; and
   a cylindrical helical ribbon electrode coupled to an output of the solid state radio frequency plasma generator, the cylindrical helical ribbon electrode further comprising:
      a plurality of spirally-connected ribbon-shaped coils, each said coil having a width and a thickness;
      the width substantially greater than the thickness and flat in a dimension facing another of said plurality of spirally-connected ribbon-shaped coils; and
      the thickness is substantially perpendicular to the width;
      a sheet of dielectric material having a spiral shape complementary to the spirally-connected ribbon-shaped coil and entwined with the spirally-connected ribbon-shaped coil to form a double helix,
   wherein the distance between the cylindrical helical ribbon electrode and a sample situated in the process chamber is less than five inches, and
   wherein the sheet of dielectric material separates adjacent said spirally-connected ribbon-shaped coils so that, when compressed, the adjacent surfaces of the spirally-connected ribbon-shaped coils do not touch.

4. The apparatus of claim 3 wherein a width of the dielectric sheet is greater than the width of the spirally-connected ribbon-shaped coils.

5. An apparatus for semiconductor processing, the apparatus comprising:
   a process chamber;

a tubular dielectric wall defining an outer wall of the process chamber;

a solid state radio frequency (RF) plasma generator coupled to the process chamber to excite a processing gas and generate a plasma;

a controller coupled to the solid state RF plasma generator to pulse the solid state RF plasma generator for each deposited layer; and a helical ribbon electrode coupled to an output of the solid state RF plasma generator, the helical ribbon electrode encircling the tubular dielectric wall so that the tubular dielectric wall is arranged between the process chamber and the helical ribbon electrode;

wherein each pass of the helical ribbon electrode overlaps a previous pass;

wherein the helical ribbon electrode has a width extending parallel to the tubular dielectric wall and a thickness extending perpendicular to the tubular wall, the width substantially greater than the thickness;

wherein each pass of the helical ribbon electrode overlaps and is generally aligned with a previous pass of the helical ribbon electrode so that a total width of the helical ribbon electrode is substantially the width of a single pass of the helical ribbon electrode.

* * * * *